(12) United States Patent
Xu et al.

(10) Patent No.: US 11,502,017 B2
(45) Date of Patent: Nov. 15, 2022

(54) EFFECTIVE HEAT CONDUCTION FROM HOTSPOT TO HEAT SPREADER THROUGH PACKAGE SUBSTRATE

(71) Applicant: INTEL CORPORATION, Santa Clara, CA (US)

(72) Inventors: Cheng Xu, Chandler, AZ (US); Zhimin Wan, Chandler, AZ (US); Lingtao Liu, Chandler, AZ (US); Yikang Deng, Chandler, AZ (US); Junnan Zhao, Gilbert, AZ (US); Chandra Mohan Jha, Chandler, AZ (US); Kyu-oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 16/215,237

(22) Filed: Dec. 10, 2018

(65) Prior Publication Data

US 2020/0185300 A1 Jun. 11, 2020

(51) Int. Cl.
| | |
|---|---|
| *H01L 23/367* | (2006.01) |
| *H01L 23/538* | (2006.01) |
| *H01L 21/48* | (2006.01) |
| *H01L 23/00* | (2006.01) |
| *H01L 25/065* | (2006.01) |
| *H01L 25/00* | (2006.01) |

(52) U.S. Cl.
CPC ...... *H01L 23/3675* (2013.01); *H01L 21/4853* (2013.01); *H01L 21/4857* (2013.01); *H01L 21/4882* (2013.01); *H01L 23/5383* (2013.01); *H01L 23/5386* (2013.01); *H01L 24/16* (2013.01); *H01L 24/17* (2013.01); *H01L 25/0655* (2013.01); *H01L 25/50* (2013.01); *H01L 2224/16227* (2013.01); *H01L 2224/17519* (2013.01)

(58) Field of Classification Search
CPC ....................................... H01L 23/40–23/4093
See application file for complete search history.

(56) References Cited

U.S. PATENT DOCUMENTS

| | | | |
|---|---|---|---|
| 6,657,864 B1* | 12/2003 | Dyckman | H01L 23/3677 361/708 |
| 6,853,068 B1* | 2/2005 | Djekic | H01L 23/4093 257/713 |
| 2017/0229368 A1* | 8/2017 | Chiu | H01L 23/055 |
| 2020/0152546 A1* | 5/2020 | Refai-Ahmed | H01L 23/481 |

* cited by examiner

*Primary Examiner* — Monica D Harrison
*Assistant Examiner* — Evan G Clinton
(74) *Attorney, Agent, or Firm* — Essential Patents Group, LLP.

(57) ABSTRACT

An integrated circuit (IC) package comprises a substrate comprising a dielectric and a thermal conduit that is embedded within the dielectric. The thermal conduit has a length that extends laterally within the dielectric from a first end to a second end. An IC die is thermally coupled to the first end of the thermal conduit. The IC die comprises an interconnect that is coupled to the first end of the thermal conduit. An integrated heat spreader comprises a lid over the IC die and at least one sidewall extending from the edge of the lid to the substrate that is thermally coupled to the second end of the thermal conduit.

21 Claims, 13 Drawing Sheets

EFFECTIVE HEAT CONDUCTION FROM HOTSPOT TO HEAT SPREADER THROUGH PACKAGE SUBSTRATE

BACKGROUND

Thermal management in integrated circuit (IC) packaging containing single or multiple integrated circuits (ICs) is becoming an increasingly important issue. Packaging for modern high-performance integrated circuits must contend with increasingly larger scale microelectronic circuit integration, including vertical integration of multiple integrated circuits. Smaller form factors are associated with increasingly higher power densities, having concomitant heat transfer challenges. High-performance ICs, such as modern multi-core microprocessor and high-bandwidth memory dies, commonly produce hotspots the die-substrate interconnect level by large current draw through individual signal and power interconnects. Conventionally, heat conduction through-the die itself is relied upon to remove heat from the hotspot to an integrated heat spreader and/or a thermal solution on the top of the die. In many cases, the die itself and thermal interface material offer a large amount of thermal resistance, limiting the efficacy of this heat transfer path. In multiple die packages, thermal cross-talk may occur between dies. For microprocessor package with integrated high-bandwidth memory, the thermal crosstalk may result in system power limitations. An alternative heat conduction path needs to be developed.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
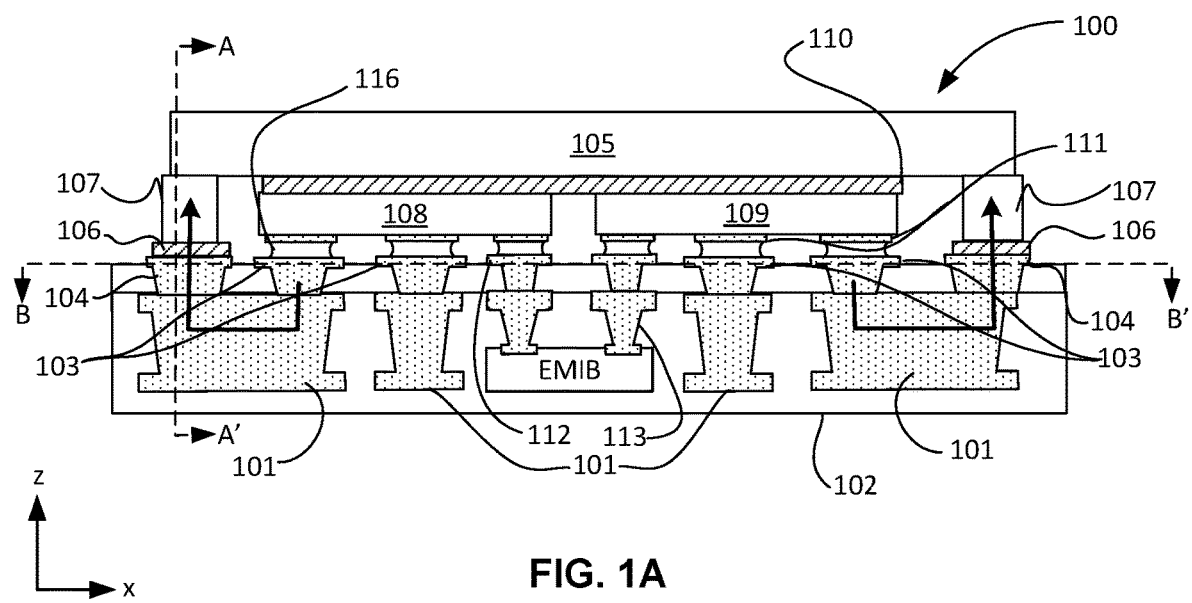
FIG. 1A illustrates a cross-sectional view in the x-z plane of an IC package comprising thermal trench vias embedded within a package substrate, according to some embodiments of the disclosure.

Described herein is a package architecture that bypasses through-die heat conduction for more effective heat removal from first interconnect-level (FLI) hotspots that may develop during operation of the in-package die(s). Embodiments of the herein-described package architecture comprise one or more thermal trench vias embedded within the dielectric of a package substrate, extending laterally below the FLI layer. The thermal trench vias are lateral vias that function as thermal conduits, conducting heat away from hotspots occurring on the die(s).

Coupled to each end of the thermal trench vias are thermal interconnects that are part of the FLI. A first thermal interconnect is thermally coupled to the die(s), and a second thermal interconnect is thermally coupled to an integrated heat spreader (IHS). The IHS comprises a lid that is interfaced to the die(s), and sidewall that extend downward from the edges of the lid to the substrate. The sidewalls are thermally coupled to the second end of the thermal trench vias through the second thermal interconnect. The conduction path provided by the thermal vias couples the hotspot directly to the integrated heat spreader through the substrate, and provides a parallel mode of heat conduction in addition to the conventional high thermal resistance path through the die and thermal interface material. In some embodiments, the disclosed thermal vias are mechanically coupled to the periphery of an integrated heat spreader that is placed over an attached die.

The heat transfer path provided by the thermal trench vias comprises high thermal conductivity (high-k, where k is the coefficient of heat conductivity) materials, such as copper. In some embodiments, the through-substrate thermal path provided by the disclosed package architecture is entirely composed of high-k materials such as copper, for rapid heat conduction from the hotspot. The high-k material may appear in the heat circuit that comprises the FLI thermal interconnect, the thermal trench via and the integrated heat spreader. Included are any intermediary structures, such as a pillar that may rise vertically from the thermal trench via to a receiving portion on the integrated heat spreader.

Here, the term "die" generally refers to a piece of semiconductor wafer that has been cut into rectangular sections referred to as dies. Each die has integrated circuitry on one or both sides.

Here, the term "thermal solution" generally refers to heat transfer components external to an IC package useful for thermal management of a high-power IC device, such as a microprocessor. These heat transfer components commonly comprise a heatsink, an integrated heat spreader and thermal interface materials. Other heat transfer components may be employed in a thermal solution.

Here, the term "integrated heat spreader" (IHS) is an IC package component that is a passive metallic structure covering the IC dies attached to the package substrate. It is bonded to the substrate, and provides a thermal interface to the thermal solution.

Here, the term "substrate" generally refers to the substrate of an IC package. The package substrate is generally coupled to the die or dies contained within the package, where the substrate comprises a dielectric having conductive structures on or embedded with the dielectric. Throughout this specification, the terms "substrate" or "package substrate" are used to refer to the substrate of an IC package.

Here, the term "first level interconnect" (FLI) generally refers to the contacts formed on the top surface of a package substrate. It is also known as the first conductive layer or first conductive level.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view in the x-z plane of IC package 100 comprising thermal trench vias 101 embedded within substrate 102, according to some embodiments of the disclosure.

IC package 100 comprises thermal trench vias 101 embedded within package substrate 102, extending laterally (e.g., in the x- and y-directions) between die-attach thermal FLIs 103 to integrated heat spreader (IHS)-attach thermal FLIs 104. In some embodiments, die-attach FLIs 103 and IHS-attach FLIs 104 are metallurgically bonded to thermal trench vias 101 (e.g., as structures electroplated over thermal trench vias 101). In some embodiments, IHS-attach thermal bond pads 104 are coupled to an IHS comprising IHS lid 105 and IHS sidewalls 107 that extend substantially orthogonally from the edges of IHS lid 105. IHS-attach thermal FLIs 104 are thermally coupled an IHS attach structure, such as the bottom edges of IHS sidewalls 107. In the illustrated embodiment, the IHS attach structure(s) is (are) IHS sidewall(s) 107.

While it is understood that the IHS may comprise other structures that attach to package substrate 102, they may be represented by IHS sidewalls 107 in this disclosure. In some embodiments, a layer of thermal interface material (TIM) 106 intervenes between IHS-attach thermal FLIs 104 and IHS sidewall 107. In some embodiments, IHS 105 extends over dies 108 and 109, providing a high thermal conductivity interface between dies 108 and 109 and a thermal solution such as a heat sink (not shown), with which the IHS may be in contact when IC package 100 is mounted (e.g., see FIG. 7). Any number of dies may be attached to package substrate 102. Dies 108 and 109 may represent multiple dies attached to package substrate 102. A second TIM layer (TIM 110) extends between IHS 105 and dies 108 and 109, and provides a thermal interface between dies 108 and 109 and IHS 105. In some embodiments, TIM layers 106 and 110 comprise a high-thermal conductivity (e.g., hi-k, where k is the coefficient of thermal conductivity) lubricant material as a paste or grease, a high-k epoxy or a solder layer.

In some embodiments, thermal trench vias 101 comprise high-k materials such as, but not limited to, copper, nickel and aluminum. Thermal trench vias 101 are embedded in package substrate 102, which comprises dielectric materials such as epoxy and phenolic resins. Such materials generally exhibit high thermal resistance, and perform as an insulating sheath surrounding trench vias 101, allowing heat flowing from dies 108 and 109 to be channeled through thermal trench vias 101 without spreading significantly through the surrounding dielectric material.

As shown in FIG. 1A, package substrate 102 comprises conductive layers interleaved with dielectric layers. In some embodiments, package substrate 102 is a bumpless build-up layer (BBUL) package substrate. With BBUL processing, package substrates are built up by successive lamination of several dielectric film laminates and electroplating copper or other metals over each the laminates to form conductive layers that comprise patterned structures and vertical vias. Vertical vias may extend between conductive layers and interconnect two or more conductive layers within the package substrate.

In some embodiments, thermal trench vias 101 are embedded within the dielectric of package substrate 102 below the FLI layer, and are not exposed at the surface. In some embodiments, thermal trench vias 101 are lateral vias that have a length and width that extend in the x- and y-directions, and may be substantially parallel to the surface of package substrate 102. In some embodiments, the length is greater than the width. In some embodiments, the length ranges between 500 and 3000 microns. In some embodiments, the width ranges between 50 and 500 microns.

The FLI layer may be the top conductive layer or level (e.g., level N). The adjacent level below the FLI layer is the second conductive layer (e.g., level N-1). Adjacent to the second conductive level is the third conductive level (e.g., N-2), etc. In the illustrated embodiment, thermal trench vias 101 are shown to extend in the z-direction between what appear as second and third conductive layers. It will be understood that the representation shown in FIG. 1A is a generalization, and not limited only to extension of the z-dimension of thermal trench vias 101 between adjacent conductive layers (e.g., between the second and the third conductive layers). Thermal trench vias may extend between non-adjacent conductive layers (e.g., between the second and fifth conductive layers) have a z-dimension (e.g., z-height) that spans two or more conductive levels. Typical layer separations in BBUL packages may be approximately 15-35 microns. Thermal trench vias may have z-heights ranging between 25 to 200 microns.

Dies 108 and 109 may be a high-performance microprocessor and memory chip, respectively, comprising high-density trace routing. Hotspots may form at various locations within the active layer on the landside of the dies due to high power demand. Thermal bond pads 111 may be distributed within a ball grid array (BGA), and located in the vicinity of potential hotspots. The potentiality of a hotspot location on the die may be determined by thermal modelling of the die, and the integrated circuit layout may be designed to include thermal bond pads 111 within the BGA. Alternatively, heat may distribute uniformly over the die.

Dies 108 and 109 may comprise thermal bond pads 111 coupled to die-attach thermal FLIs 103 by solder bonds, represented by solder joints 116. Thermal bond pads 111 may provide paths for heat to flow to thermal sinks within package substrate 102. The thermal sinks may be provided by thermal trench vias 101, drawing heat from dies 108 and 109 into package substrate 102. As illustrated, heat may flow from die-attach thermal FLIs 103, coursing through thermal trench vias 101 to IHS-attach FLIs 104. IHS 105 is coupled to the thermal trench vias 101 by the IHS-attach FLIs, thus providing a thermal sink for dissipating the heat ultimately to a thermal solution heat sink (e.g., see FIG. 7). The arrows drawn through thermal trench vias 101 indicate the described flow path.

Electrical routing within package substrate 102 is represented by signal/power FLIs 112, distinguished from the thermal FLIs (e.g., die-attach FLIs 103 and IHS-attach FLIs 104). In the illustrated embodiment, signal FLIs 112 are coupled to an embedded multi-die interconnect bridge (EMIB) through electrical vias 113. In the exemplary embodiment shown in FIG. 1A, the EMIB bridges signal routing between dies 108 and 109. In general, an EMIB may interconnect multiple dies mounted on package substrate 102. In the illustrated embodiment, the EMIB is shown to be embedded in package substrate 102 at the third conductive layer. Electrical vias 113 may extend from an embedded conductive layer (e.g., the second conductive level of package substrate 102, as shown) to the EMIB, coupling signal FLIs 112 to the EMIB. It is understood by persons skilled in the art that the EMIB may be embedded within other conductive layers within package substrate 102. The EMIB is shown for illustrative purpose. It will be understood that in some embodiments, package substrate 102 does not comprise an EMIB. It will be understood by persons skilled in the art that in some embodiments, an interposer may be employed for interconnecting two or more dies. In other embodiments, direct trace interconnect subsurface routing may be employed for electrical communication between horizontally mounted multiple dies.

Figure 1B:
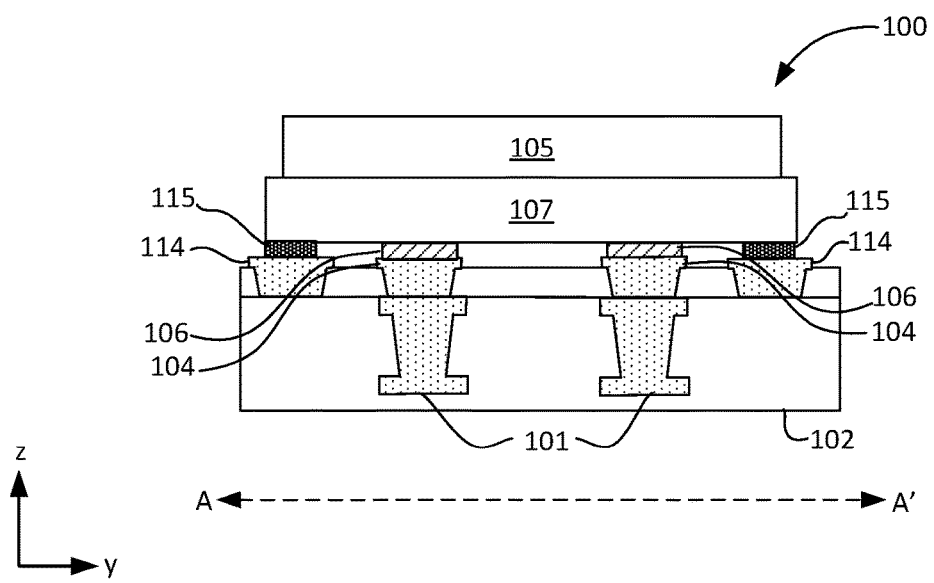
FIG. 1B illustrates a cross-sectional view in the y-z plane of an IC package comprising thermal trench vias embedded within a package substrate, according to some embodiments of the disclosure.

FIG. 1B illustrates a cross-sectional view in the y-z plane of IC package 100 IC package 100 comprising thermal trench vias 101 embedded within substrate 102, according to some embodiments of the disclosure.

The cross-sectional view of IC package 100 in the y-z plane is taken along cut A-A' in FIG. 1A, rotated 90° from the view shown in FIG. 1A. The thermal trench vias 101 depicted in FIG. 1B are shown in profile in FIG. 1A. IHS sidewall 107 extends in the z-direction from IHS 105, and interfaces to package substrate 102. In the y-z plane of the figure, IHS sidewall 107 is viewed broadside, showing thermal coupling points where IHS-attach FLIs 104 are punctually coupled (e.g., coupled at specific points along IHS sidewall 107) to IHS sidewall 107 along its bottom edge.

In some embodiments, TIM 106 is positioned between IHS sidewall 107 and IHS-attach FLIs 104. In general, TIM is a high-viscosity liquid compound or paste having a high thermal conductivity (e.g., between 0.5 and 3 W/mK or greater, where W is watts, m is meters and K is degrees Kelvin). In some embodiments, TIM 106 comprises an adhesive component that bonds IHS sidewall 107 to IHS-attach FLIs 104 as well as providing a low thermal resistance bond. In alternate embodiments, TIM 106 comprises an adhesive component (e.g., a high thermal conductivity adhesive), allowing mechanical bonding of IHS sidewall 107 to package substrate 102 at the IHS-attach FLIs 104. In some embodiments, IHS sidewall 107 is mechanically coupled to package substrate 102 by mechanical anchor structures, described below. In the illustrated embodiment, two points of thermal coupling are shown, but it is understood that multiple points of thermal coupling are possible, including all points along the bottom edge of IHS sidewall 107.

In addition to thermal coupling points, IHS sidewall 107 is mechanically coupled to anchor pads 114 by adhesive layers 115. Anchor pads 114 may be subtended by anchor vias (not shown) extending into deep subsurface regions of package substrate 102, rooting anchor pads 114 to package substrate 102. In the illustrated embodiment, adhesive layers 115 intervene between IHS sidewall 107 and anchor pads 114 to cement IHS sidewall 107 to package substrate 102. In some embodiments, adhesive layers 115 comprise epoxy resins. In general, the epoxy resins have a large thermal resistance (e.g., having thermal conductivities k of 0.5 W/mK or less). In some embodiments, adhesive layers 115 have a relatively large thermally conductivity (e.g., k=3 W/mK or greater) in comparison to non-thermally conductive adhesives. Thermally conductive adhesives may cement IHS sidewall 107 to anchor pads 114 and provide a secondary heat conduction path through anchor vias if present, allowing some heat to flow to the bottom of package substrate 102 where it may diffuse into a printed circuit board.

Figure 1C:
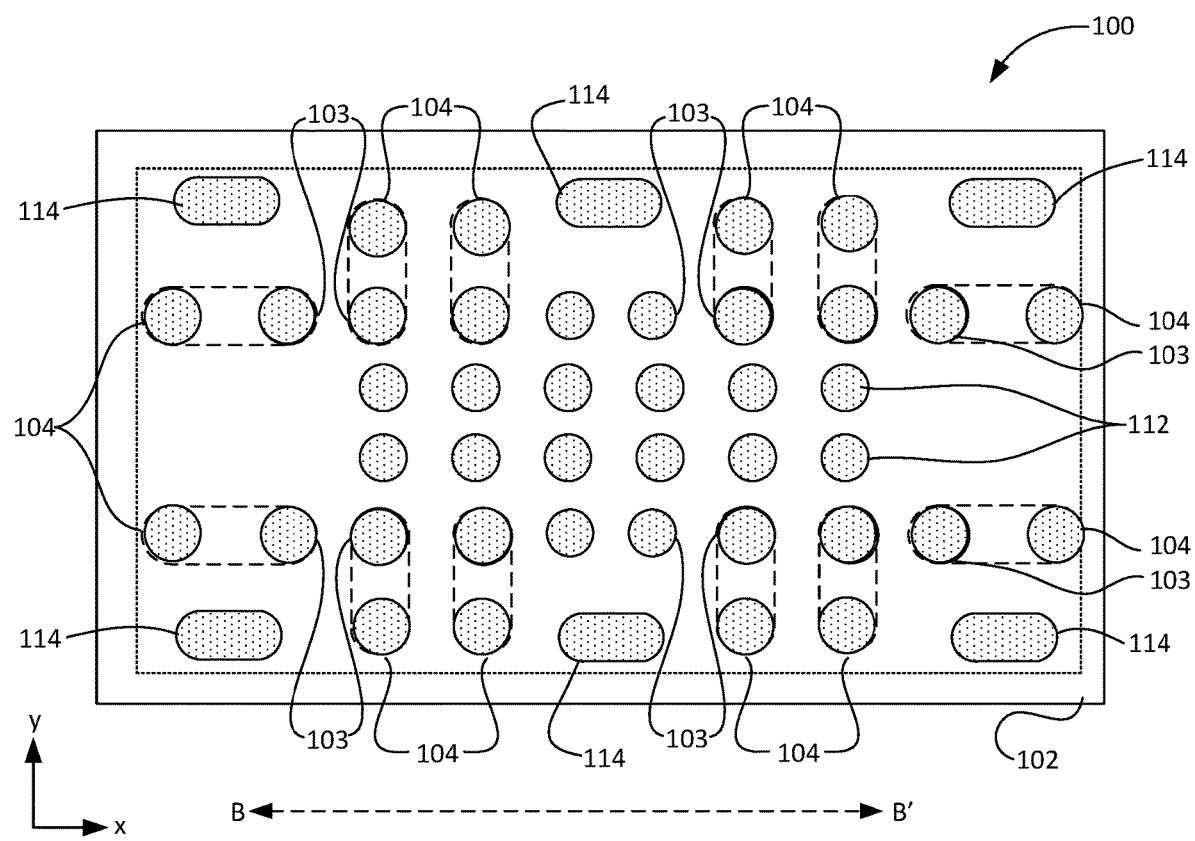
FIG. 1C illustrates a plan view in the x-y plane of package substrate 100, comprising thermal trench vias embedded within a package substrate, according to some embodiments of the disclosure.

FIG. 1C illustrates a plan view in the x-y plane of package substrate 100, comprising thermal trench vias embedded within a package substrate, according to some embodiments of the disclosure.

The view in FIG. 1C is of the x-y plane taken along cut line B-B' in FIG. 1A, showing an overhead view of a configuration of FLIs on the top layer of package substrate 102. The plan view shows an example of a distribution of various types of FLIs within a die-attach area, denoted by the dotted rectangle encompassing the FLIs, including die-attach FLIs 103, IHS-attach FLIs 104, and signal FLIs 112. Dashed lines extending between die-attach FLIs 103 and IHS-attach FLIs 104 indicate sub-surface (e.g., embedded) thermal trench vias (e.g., thermal trench vias 101) within package substrate 102 below the FLI layer. In some embodiments, thermal FLIs (e.g., die-attach FLIs 103 and IHS-attach FLIs 104) are arranged along the peripheral regions of the die-attach area. Signal FLIs 112 are shown to be concentrated in near the central region of the die-attach area, but it will be understood by persons having ordinary skill in the art that signal FLIs 112 and thermal FLIs may be arranged in any number of suitable configurations.

Anchor pads 114 are shown to be distributed along the periphery of the die-attach area, occupying corners and positions between corners of the die-attach area. It will be understood by persons having ordinary skill in the art that anchor pads 114 may be arranged in any number of other suitable configurations with FLIs, according to design or other considerations. In some embodiments, anchor pads 114 are employed as attachment points for IHS 105. As described above, an adhesive (e.g., adhesive layer 113) may be employed to bond IHS sidewalls 107 to anchor pads 114. In some embodiments, the adhesive (e.g., adhesive layer 113) has a relatively high thermal conductivity (see above), permitting anchor pads 114 to conduct heat from an attached die (e.g., die 108 or 109).

Figure 2A:
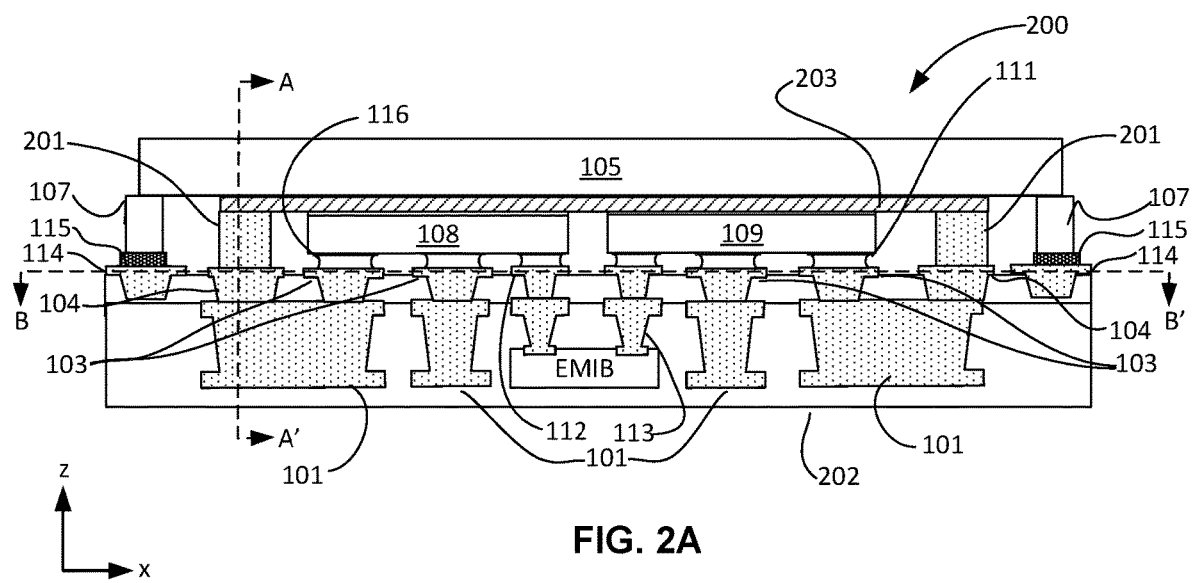
FIG. 2A illustrates a cross-sectional view in the x-z plane of an IC package comprising thermally conductive pillars extending in the z-direction from IHS-attach FLIs, according to some embodiments of the disclosure.

FIG. 2A illustrates a cross-sectional view in the x-z plane of IC package 200, comprising thermally conductive pillars 201 extending in the z-direction from IHS-attach FLIs 104 to IHS lid 105, according to some embodiments of the disclosure.

IC package 200 comprises thermal trench vias 101 embedded within package substrate 202, extending laterally (e.g., in the x- and y-directions) between die-attach FLIs 103 and IHS-attach FLIs 104. Pillars 201 extend in the z-direction over IHS-attach FLIs 104, reaching TIM 203 which may be disposed between IHS lid 105, tops of pillars 201 and dies 108 and 109. In some embodiments, pillars 201 replace IHS sidewalls 107 as the thermal conduit between IHS lid 105 and thermal trench vias 101. In some embodiments, pillars 201 have a rectangular or square cross-section in the x-y plane, and have a width in the x (or y) direction ranging between 100 and 3000 microns. Although pillars 201 are represented in FIG. 2A by apparently narrow structures, in some embodiments, pillars 201 extend the width or length of package substrate 202, forming walls (not shown) having a width of the package substrate (e.g., 5000 microns). Extended pillars may bridge over several thermal trench vias. In some embodiments, pillars 201 have a z-height over IHS-attach FLIs 104 ranging between 100 and 1000 microns. In some embodiments, the z-height of pillars 201 may range between 200 and 1000 microns, and include the thickness of the attached dies 108 and 109, including the thicknesses of solder joints 116. In some embodiments, pillars 201 comprise high-k materials such as, but no limited to, copper, gold, silver, nickel and aluminum.

In some embodiments, pillars 201 are metallurgically integral with IHS-attach FLIs 104, and form a unitary structure (e.g., by electroplating pillars 201 over IHS-attach FLIs 104). Pillars 201 may comprise the same material as IHS-attach FLIs 104 (e.g., copper). In some embodiments, pillars 201 extend in the z-direction between IHS lid 105 and IHS attach FLIs 104. In the illustrated embodiment, pillars 201 are primarily heat conduits, and IHS sidewalls 107 may primarily perform the function of mechanically securing the IHS to package substrate 202. Adhesive layer 115 may intervene between IHS sidewalls 107 to bond IHS sidewalls to package substrate 202. In some embodiments, anchor pads 114 are integral with anchor vias (not shown), rooting anchor pads 114 deeper within package substrate 202, thereby stabilizing the IHS-package substrate bond. Pillars 201 may serve a secondary function of structurally stabilizing the IHS and IC package 200 as a whole.

Figure 2B:
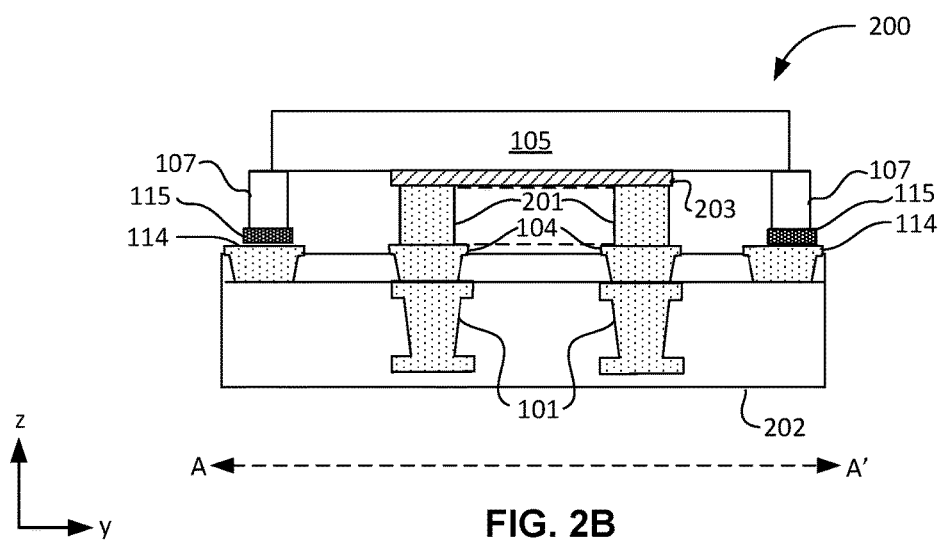
FIG. 2B illustrates a cross-sectional view in the y-z plane of an IC package comprising thermally conductive pillars extending in the z-direction from IHS-attach FLIs, according to some embodiments of the disclosure.

FIG. 2B illustrates a cross-sectional view in the y-z plane of IC package 200, according to some embodiments of the disclosure.

The cross-sectional view of FIG. 2B is orthogonal to the view of IC package 200 shown in FIG. 2A, and is taken along cut line A-A' at the periphery of the IHS in FIG. 2A. In the illustrated embodiment, pillars 201 extend to each thermal trench via 101 shown in the figure. In some embodiments, multiple (more than two) thermal trench vias 101 and pillars 201 are distributed along any side of IC package 200. In some embodiments, pillars 201 extend laterally to span across the distance between thermal trench vias 101, joining to form a wall, as indicated by the dashed rectangle spanning the space between pillars 201 in the figure.

In some embodiments, IHS lid 105 has a width (e.g., extending in the y-direction of the figure) that generally may exceed the width of an attached die. Sidewalls 107 straddle IHS-attach FLIs 104 in IC package 200, and are bonded to anchor pads 114 by adhesive layer 115. In the illustrated embodiment, TIM 203 extends between pillars 201 inclusively. In some embodiments, TIM 203 extends beyond pillars 201 and may cover the entire bottom side of IHS lid 105.

Figure 2C:
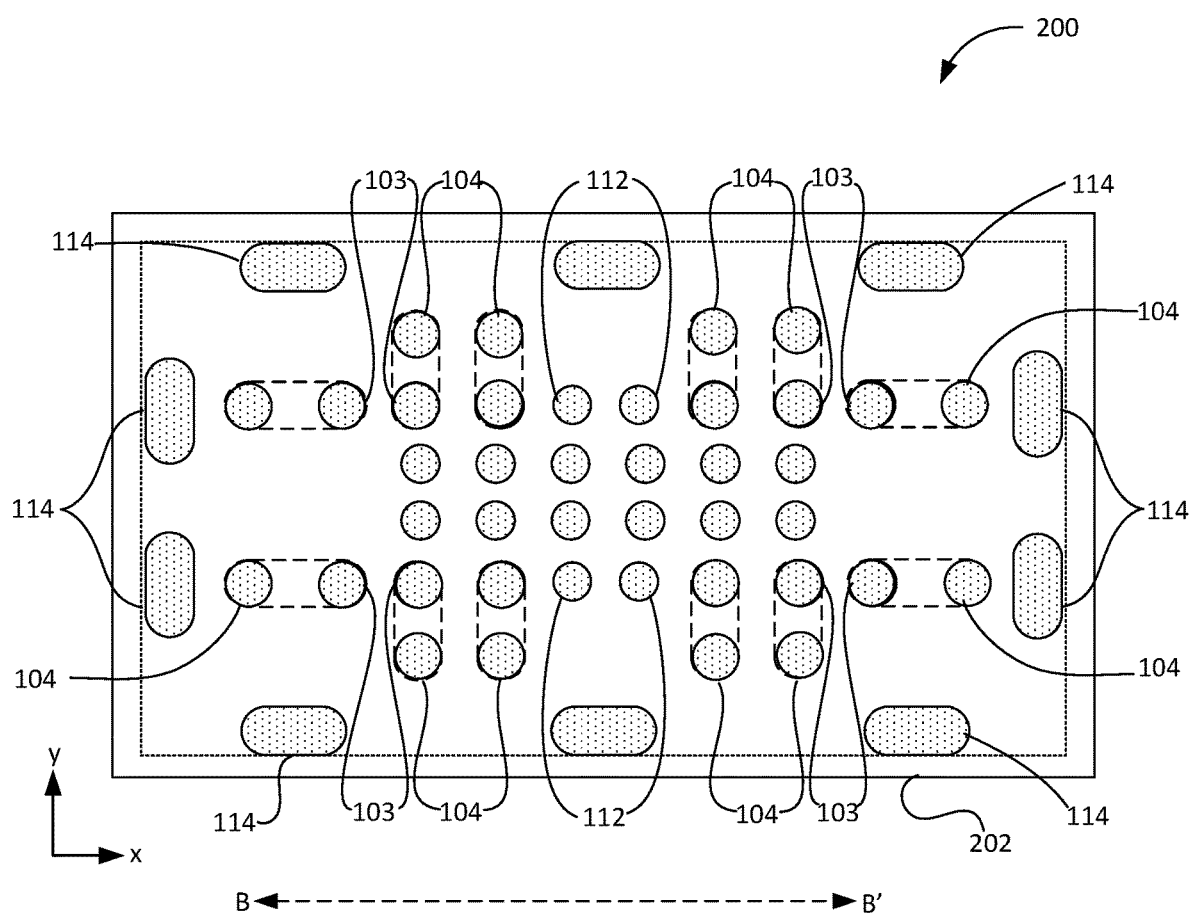
FIG. 2C illustrates a plan view in the x-y plane of an IC package comprising thermally conductive pillars extending in the z-direction from IHS-attach FLIs, according to some embodiments of the disclosure.

FIG. 2C illustrates a plan view in the x-y plane of IC package 200, according to some embodiments of the disclosure.

The view of IC package 200 is in the x-y plane containing cut line B-B' in FIG. 2A. The plane cuts IC package 200 through the FLI layer of package substrate 202, showing an exemplary distribution of FLI contact pads (e.g., die-attach FLIs 103, IHS-attach FLIs 104 and anchor pads 114). In the illustrated embodiment, anchor pads 114 are arranged at the periphery of the die attach area, delineated by the dotted rectangular outline within package substrate 202. The peripheral placement of anchor pads 114 may coincide with placement of IHS sidewalls 107 extending downward (in the z-direction) from IHS lid 105, and attached to anchor pads 114 as shown in FIGS. 2A and 2B. The dotted lines may also indicate an exemplary outline of IHS sidewalls 107, showing approximate limits of lateral coverage by the IHS that extends over the peripheral positions of anchor pads 114.

Also shown in plane in FIG. 2C view is an exemplary configuration of signal FLIs 112, shown to have a smaller diameter than the thermal FLIs (e.g., die-attach FLIs 103 and IHS-attach FLIs 104). The smaller diameters of signal FLIs 112 may reflect a relatively lower current-carrying capacity requirement for signal conduction FLIs in comparison to electrical power FLIs (not shown). Thermal FLIs such as die-attach FLIs 103 and IHS-attach FLIs 104 may have diameters comparable to electric power FLIs. In the illustrated embodiment, die-attach thermal FLIs 103 are distributed along a periphery of an array of signal FLIs 112. In some embodiments, arrays of signal FLIs 112 may interpenetrate arrays of die-attach thermal FLIs 103. In alternative embodiments, die-attach thermal FLIs 103 may be interspersed at positions within an array of signal FLIs 112, where the positions of the thermal FLIs are in the vicinity a potential hotspot due to high power load when an attached die is in operation.

Figure 3:
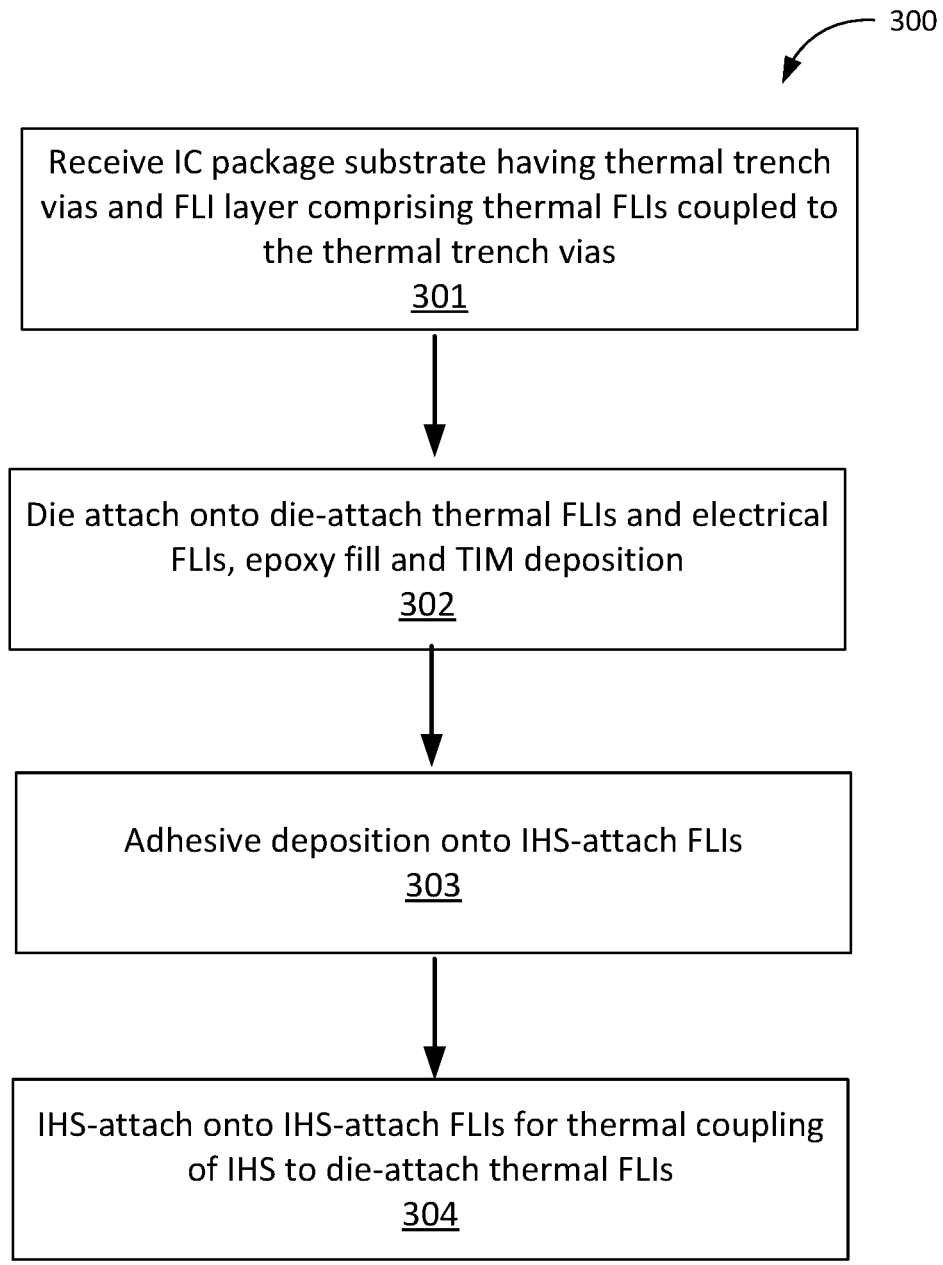
FIG. 3 illustrates a flow chart summarizing an exemplary process for making an IC package having thermal trench vias and thermal FLIs, according to some embodiments of the disclosure.

FIG. 3 illustrates flow chart 300 summarizing an exemplary process for making IC package 100 having thermal trench vias and thermal FLIs, according to some embodiments of the disclosure.

At operation 301, an IC package substrate (e.g., IC package substrate 102) is received having a pre-formed thermal trench vias (e.g., thermal trench vias 101) embedded in the dielectric of package substrate (e.g., package substrate 102). A FLI layer may also be pre-formed, comprising thermal FLIs (e.g., die-attach thermal FLIs 103 IHS-attach FLIs 104). Anchor pads (e.g., anchor pads 114) may be included in the FLI layer. In some embodiments, the FLIs of the FLI layer and thermal trench vias comprise copper. In alternate embodiments, the FLI layer comprises any one of nickel, aluminum, gold or silver.

At operation 302, one or more die(s) (e.g., die 108 and/or die 109) is (are) attached to the IC package substrate received in operation 301. The die attach process may be a flip-chip (e.g., C4) process, where the contacts on the front side of the die are arranged in grid patterns and solder-bumped, where a ball of solder is deposited on each contact, forming a solder "bump". The resulting array of solder balls is a ball grid array (BGA) on the front side of the die, as part of the active layer of the die that contains the integrated circuitry. The BGA may comprise thermal contacts in addition to electrical contacts (signal and power), where the thermal contacts are specifically intended to bond to thermal FLIs on the IC package substrate. In flip-chip packaging, the die is flipped to turn the bottom side of the die upwards, and the BGA is mated with the FLIs on the IC package substrate. Bonding of the die to the IC package substrate may be accomplished by solder reflow.

Once the die(s) is (are) bonded, an epoxy fill may be optionally performed to pot the dies in a dielectric matrix. A grinding or polishing operation may be performed to remove epoxy from the backside the die to expose its surface. In a subsequent operation, a TIM layer (e.g., TIM 110) is deposited on the exposed backside surface of the die(s).

At operation 303, a layer of adhesive is deposited over the anchor pads (e.g., anchor pads 114). In some embodiments, the adhesive layer (e.g., adhesive 115) comprises any one of an epoxy resin, a silicone resin or a composite inorganic/polymeric material. The layer of adhesive may be deposited by any suitable method, such as, but not limited to, printing or lithographic patterning of a spin-coated or spray-coated layer of the adhesive.

In a subsequent or simultaneous operation, thermal FLIs for IHS attach (e.g., IHS-attach FLIs 104) are coated with a TIM (thermal interface material) layer. The TIM (e.g., TIM 106) may be the same composition as TIM 110. In general, a TIM layer is a layer comprising a grease or a paste that is dispensed. Generally, TIMs do not contain adhesive components. In some embodiments, the TIM exhibits adhesive properties and may be considered a thermally-conductive adhesive. The adhesive TIM, or conversely, a high-thermal conductivity adhesive may have thermal conductivities of up to 10 W/mK. In contrast, non-thermal adhesives have thermal conductivities of less than 1 W/mK.

At operation 304, the IHS is attached to the IC package. The attach process may employ a pick-and-place technique to accurately place the IHS sidewalls (e.g., IHS sidewalls 107) over the anchor pads (e.g., anchor pads 114) and the IHS-attach FLIs (e.g., IHS-attach FLIs 104). The attach operation may include a curing operation, where the adhesive is cured at an elevated temperature to form a bond between the anchor pads and the IHS sidewalls.

FIGS. 4A-4D illustrate an exemplary method for fabricating IC package 100, showing in a series of cross-sectional views the progression of IC package 100 fabrication as principal operations are completed, according to some embodiments of the disclosure.

Figure 4A:
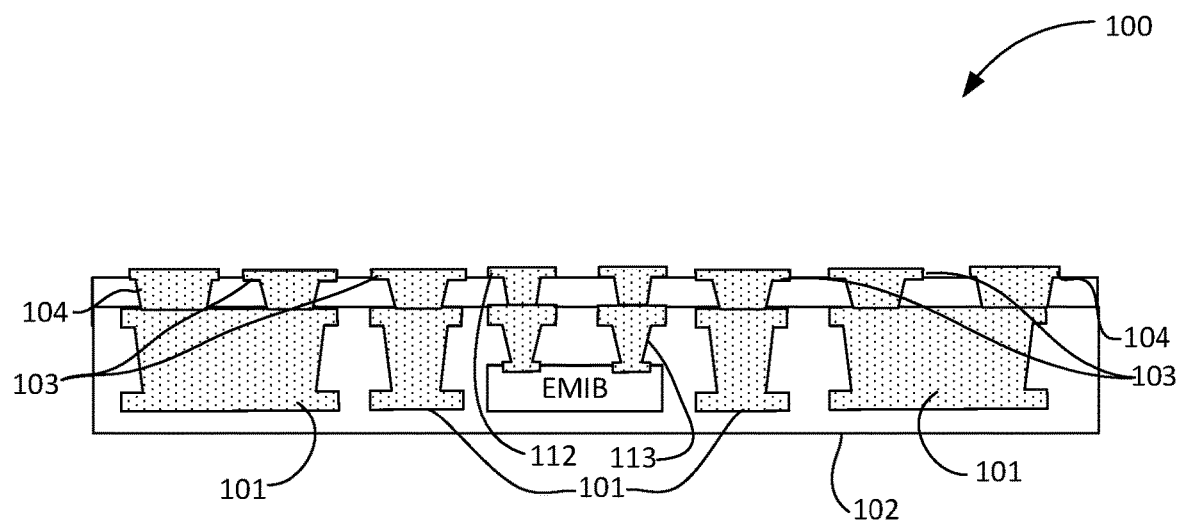
FIGS. 4A-4D illustrate an exemplary method for fabricating an IC package having thermal trench vias and thermal FLIs, showing in a series of cross-sectional views the progression of the IC package fabrication as principal operations are completed, according to some embodiments of the disclosure.

In the operation shown in FIG. 4A, package substrate 102 is received, having thermal trench vias 101 and a complete FLI layer comprising die-attach FLIs 103, IHS-attach FLIs 104 and signal FLIs 112. In some embodiments, package substrate 102 is completed to the FLI layer as received. In some embodiments, the FLI layer is added after receiving package substrate 102 at an earlier stage of completion. In some embodiments, package substrate 102 comprises an embedded multi-die interconnect bridge (EMIB). If an EMIB is present, it may be coupled to signal FLIs 112 through vias 113, bridging signal (and power) routing between a first die (e.g., die 108) and a second die (e.g., die 109).

In some embodiments, package substrate 102 is a bumpless build-up layer (BBUL) package, formed by stacking and bonding laminates of dielectric film, interleaved with patterned conductive layers, each conductive layer forming a conductive level. Package substrate 102 may have a core or be a coreless substrate. The patterned conductive layers include the first-level interconnect (FLI) layer on the top surface of the substrate. Patterned conductive layers at lower levels within the dielectric are vertically interconnected by vias (e.g., vias 113), including thermal trench vias 101. Vertical interconnections enabled by vias such as vias 113 provide electrical interconnects between conductive levels. Thermal trench vias 101 are to be principally employed as through-substrate thermal pathways for removal of heat from attached dies. In some embodiments, thermal trench vias 101 are coupled to electrical routing and may carry electric current.

Figure 4B:
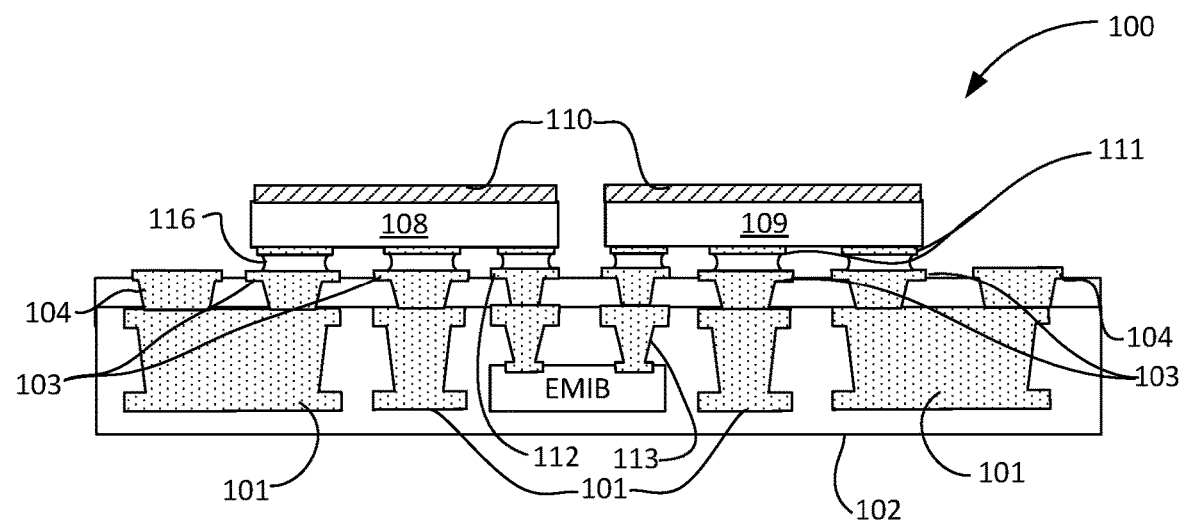

In the operation shown in FIG. 4B, attachment of one or more dies (e.g., dies 108 and 109) is performed, followed by application of a TIM (e.g. TIM 110). Die attach may be a flip-chip operation, where the die(s) is (are) attached face-down over package substrate 102, with the backside of the die(s) facing upward. Dies may be bumped (e.g., solder balls deposited) on on-die contact pads, forming a ball grid array (BGA). In the flip-chip operation, dies 108 and 109 may be placed on package substrate 102 (e.g., by a pick-and-place operation) and aligned to the FLI contacts (e.g., die-attach FLIs 103 and signal FLIs 112). Solder bumps may then be reflowed in a subsequent operation, forming solder joints 116 between die pads and FLIs.

Following die attach, a TIM (e.g., TIM 110) may be deposited over dies 108 and 109. TIM 110 has been described above. A suitable deposition process may include printing by an ink-jet technique or dispensed by a micronozzle. In some embodiments, an epoxy fill may be deposited to pot dies 108 and 109 by suitable deposition methods. The epoxy fill is not shown for clarity. The epoxy fill may be followed by a grinding and/or polishing step (e.g., by chemo-mechanical polishing, CMP) to expose the backside of dies 108 and 109. The exposure may be necessary for a low-thermal resistance contact with TIM 110.

Figure 4C:
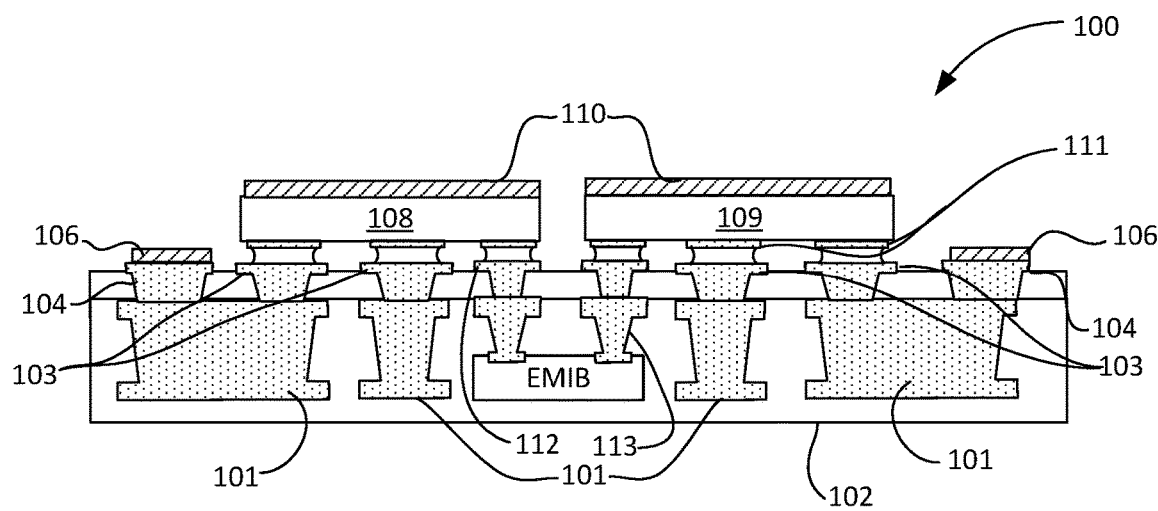

In the operation shown in FIG. 4C, a second TIM layer (e.g., TIM 106) is deposited on IHS-attach FLIs 104. TIM 106 has been described above. In some embodiments, TIM 106 is a high-viscosity non-adhesive liquid, such as a thermal grease or paste. In some embodiments, TIM 106 is a high-thermal conductivity adhesive. For the later embodiments, TIM 106 may be cured by exposure of TIM 106 to elevated temperatures after IHS attach described in the following operation.

Simultaneously, adhesive layers (e.g., adhesive 115) are deposited on anchor pads (e.g., anchor pads 114) around the attach periphery (not shown in FIG. 4C; see FIG. 1C). Adhesive layers may be cured by treatment at elevated temperatures after IHS attach.

Figure 4D:
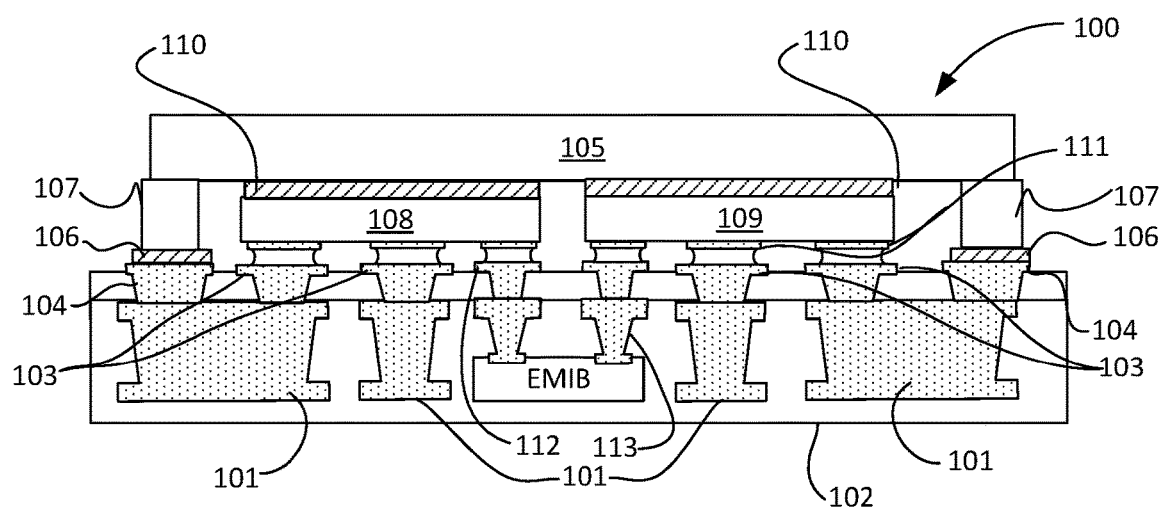

In the operation shown in FIG. 4D, an IHS is attached to package substrate 102. The IHS comprises IHS lid 105 and IHS sidewalls 107 extending substantially orthogonal to IHS lid 105 in the z-direction from the periphery of IHS lid 105. In some embodiments, the IHS is attached by a pick-and-place operation, where IHS sidewalls 107 are aligned with the configuration of IHS-attach FLIs 104 and peripheral anchor pads (e.g., as shown in FIG. 1C) and placed in contact with TIM 106.

In some embodiments, TIM 106 is a thermally conductive adhesive. Once placed, IHS sidewalls 107 may be bonded to anchor pads 114 (not shown) by curing adhesive 115 (not shown), along with curing an adhesive form of TIM 106.

The IHS attach operation may complete assembly of IC package 100. In some embodiments, IC package 100 may be potted in an encapsulant to protect the components and further stabilize the IHS attachment. The encapsulant may comprise an epoxy resin, but other suitable materials may be employed. To expose the top of IHS lid 105, a grind and/or polish operation may be employed.

Figure 5:
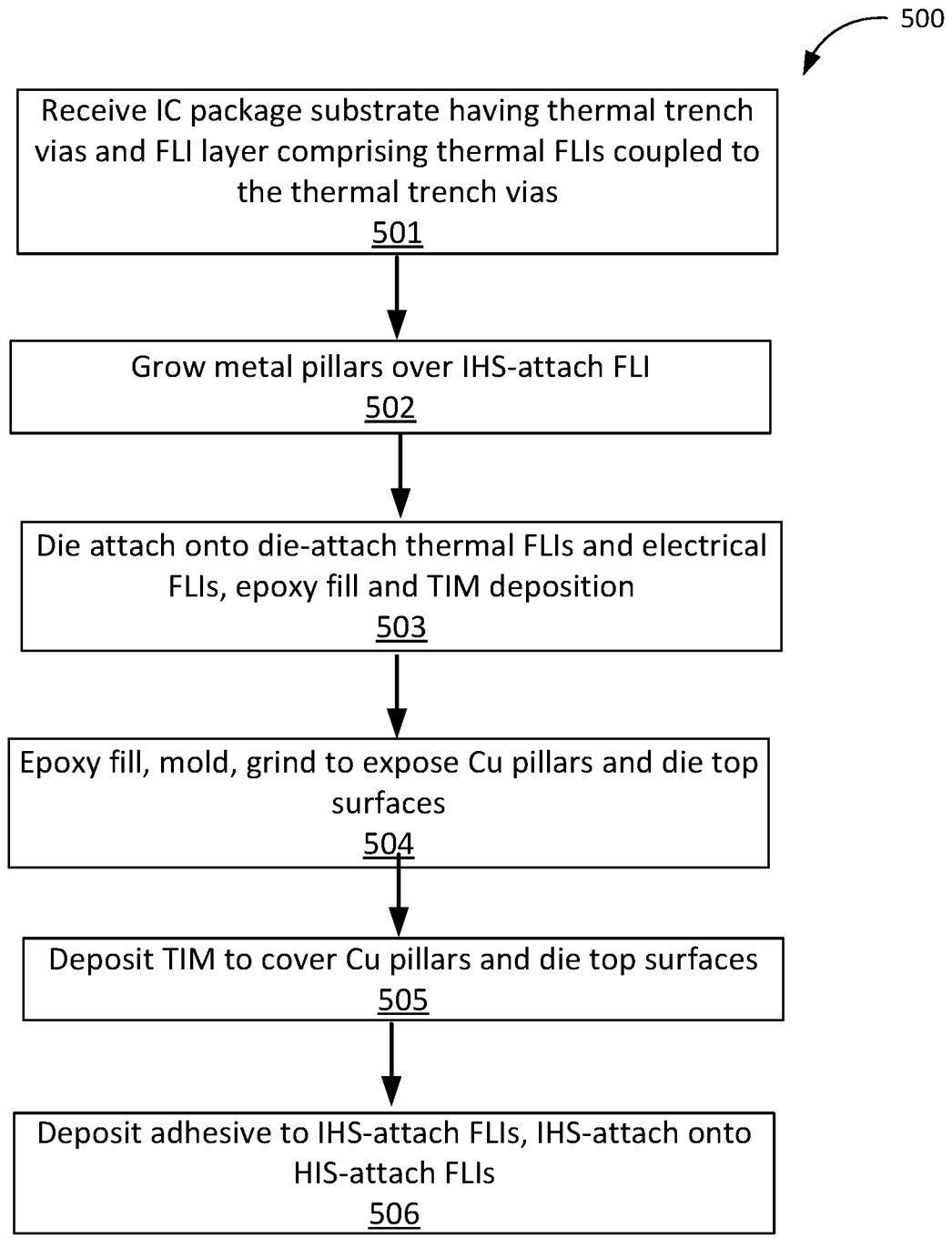
FIG. 5 illustrates a flow chart summarizing an exemplary process for making an IC package having thermal trench vias and thermal FLIs, and comprising thermally conductive pillars extending in the z-direction from IHS-attach FLIs, according to some embodiments of the disclosure.

FIG. 5 illustrates flow chart 500 summarizing an exemplary process for making IC package 200, according to some embodiments of the disclosure.

At operation 501, an IC package substrate (e.g., IC package substrate 102) is received having a pre-formed thermal trench vias (e.g., thermal trench vias 101) embedded in the dielectric of package substrate (e.g., package substrate 102). A FLI layer may also be pre-formed, comprising thermal FLIs (e.g., die-attach thermal FLIs 103 IHS-attach FLIs 104). In some embodiments, the FLIs of the FLI layer and thermal trench vias comprise copper. Anchor pads (e.g., anchor pads 114) may be included in the FLI layer. In some embodiments, anchor pads are displaced laterally from thermal FLIs to an outer perimeter, in order to attach an IHS that is wider than the IHS in IC package 100. In some embodiments, the FLI layer comprises copper. In alternate embodiments, the FLI layer comprises any one of nickel, aluminum, gold or silver.

At operation 502, metal pillars (e.g., pillars 201) are grown over IHS-attach FLIs (e.g., IHS-attach FLIs 104). The metal pillars are conductive structures that may comprise a metal. An exemplary metal is copper, but other suitable metals are possible. The metal pillars may be grown by electrodeposition or electroless deposition techniques over IHS-attach FLIs, and have circular or rectangular cross-sections. Deposition techniques may include lithographically-defined through-mask plating. In some embodiments, the pillars have z-heights ranging between 200 and 1000 microns, with widths ranging between 100 and 500 microns. In some embodiments, pillars 201 are produced separately as stand-alone pieces and added to the substrate by a pick-and-place operation. The added pillars may be solder-bonded to IHS-attach FLIs 104. In some embodiments, pillars 201 are part of IHS sidewalls 107.

At operation 503, one or more dies (e.g., die 108 and/or die 109) is (are) attached to the IC package substrate that was received in operation 501. The die attach process may be substantially as described for operation 302 shown in FIG. 3.

At operation 504, a series of operations including epoxy fill and molding, grind/polish of the epoxy fill. As mentioned above for operation 302, the epoxy fill is not shown in FIGS. 2A and 2B for clarity. In the present operation, tops of the pillars are exposed by a grind and/or polish operation. The pillars may be made planar (e.g., having the same z-height) with the tops of the attached dies by the grind/polish operation.

At operation 505, a TIM layer (e.g., TIM layer 110) is deposited over the tops of the pillars (e.g., pillars 201) and over the backside of dies attached to the package substrate (e.g., dies 108 and/or 109). The deposition process may include a jet printing operation, where the TIM material may be deposited over the entire top of the IC package, covering the exposed tops of the pillars and dies, and over the top surface of the epoxy fill. The deposition process may also include a nozzle liquid dispensing tool to dispense the TIM material by positioning a nozzle over the appropriate surfaces and flowing the liquid TIM over the areas to be covered, including the exposed tops of the pillars and the exposed die surfaces. These surfaces are to interface with an IHS lid (e.g., IHS lid 105) in a subsequent IHS attach operation.

At operation 506, an IHS is attached to the package substrate. The IHS sidewalls (e.g., IHS sidewalls 107) may be positioned and aligned with pillars and anchor pads by a pick-and-place tool. The lid of the IHS (e.g., IHS lid 105) is aligned to contact the pillars. Preceding the IHS attach operation, an adhesive is deposited over anchor pads (e.g., adhesive 115 over anchor pads 114). The adhesive may cement the IHS to the package substrate and immobilize it to prevent separation between the pillars and the lid of the IHS during handling.

FIGS. 6A-6F illustrate an exemplary method for fabricating IC package 200, showing in a series of cross-sectional views the progression of IC package 200 fabrication as principal operations are completed, according to some embodiments of the disclosure.

Figure 6A:
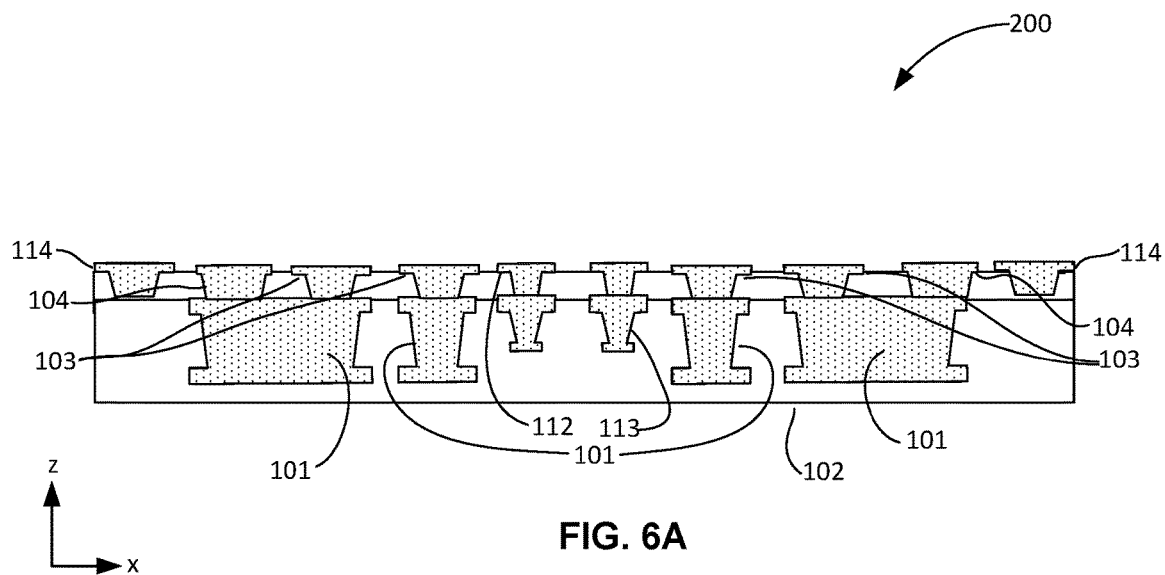
FIGS. 6A-6F illustrate an exemplary method for fabricating an IC package having thermal trench vias and thermal FLIs, and comprising thermally conductive pillars extending in the z-direction from IHS-attach FLIs, showing in a series of cross-sectional views the progression of the IC package fabrication as principal operations are completed, according to some embodiments of the disclosure.

In the operation shown in FIG. 6A, a partially complete IC package 200 in the form of package substrate 202 is received from an upstream operation. In some embodiments, package substrate 202 is received having preformed thermal trench vias 101 embedded within the dielectric of package substrate 202. In some embodiments, package substrate 202 has a complete FLI layer, including die-attach FLIs 103 and IHS-attach FLIs 104 as shown in FIGS. 2A and 6A. The FLI layer may also include signal FLIs 112. Also included are anchor pads 114. In some embodiments, an EMIB (not shown) is embedded within package substrate 202, coupled to some signal FLIs 112 through signal-(or power-) carrying electrical vias 113. As mentioned above, an EMIB may not be included within package substrate 202, and subsurface or surface trace routing may be employed to interconnect multiple dies. Alternatively, an interposer may be employed to interconnect multiple dies.

In some embodiments, package substrate 202 is a multi-level package substrate. In the illustrated embodiment, the top three conductive layers are shown (e.g., normally designated from top down: N, N-1, N-2). The FLI level is the top-most level, or conducive layer (e.g., level N). Thermal trench vias 101 and electrical vias 113 extend in the z-direction between the second conductive layer (e.g., N-1) and the third conductive layer (e.g., N-2). In some embodiments, conductive layers more deeply embedded within package substrate 102 (e.g., at levels N-3, N-4, etc.) are below thermal trench vias 101 and electrical vias 113.

Figure 6B:
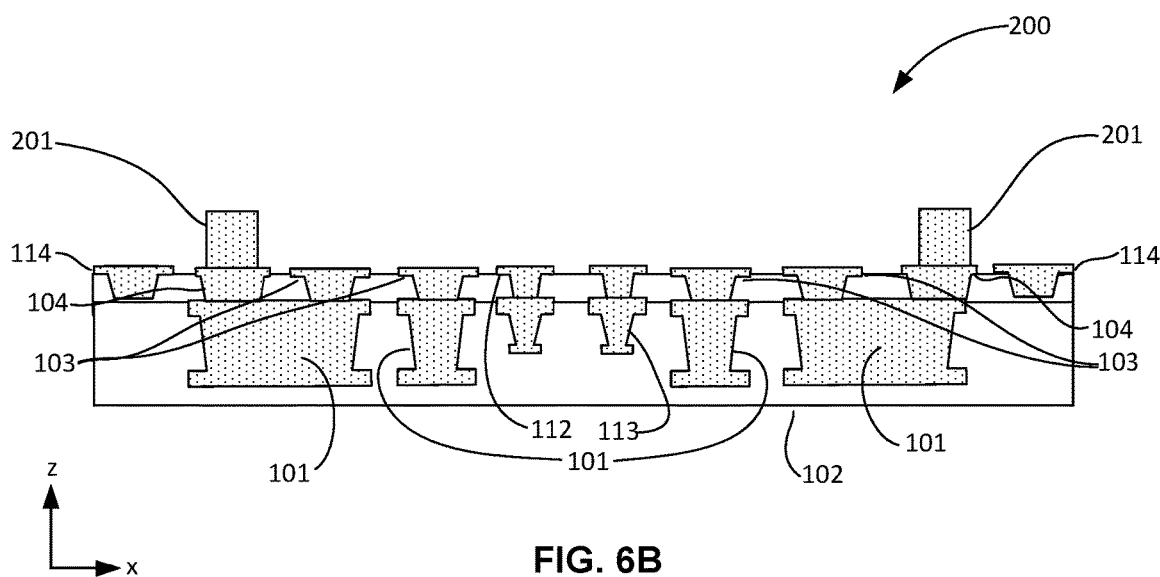

In the operation shown in FIG. 6B, pillars 201 are grown on IHS-attach FLIs 104. In some embodiments, pillars are electroplated through openings in a lithographic plating mask. The plating mask may comprise a thick-film photoresist that is a dry film resist or a thick-layer photoresist deposited as a liquid (e.g., SU8). The plating mask may have a thickness ranging between 200 and 1000 microns to form pillars having a z-height that is substantially the same as the mask thickness. In some embodiments, openings in which pillars are plated are round, or alternatively, rectangular, producing pillars having a round or rectangular cross-section, respectively. Pillar widths may range between 100 and 3000 microns. In some embodiments, package substrate 202 is received with pillars previously formed in an upstream operation.

Figure 6C:
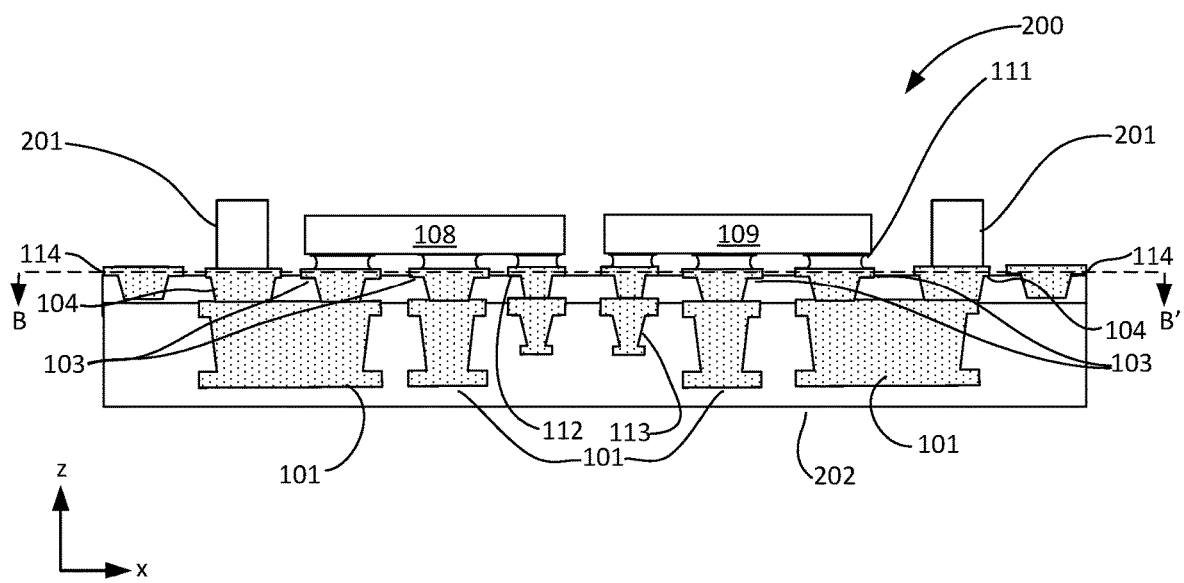

In the operation shown in FIG. 6C, dies 108 and 109 are attached to package substrate 202. As described above for FIG. 4C, dies 108 and 109 may be attached to package substrate 202 by a flip-chip operation. Dies 108 and 109 may comprise BGAs. After alignment and touch-down over the FLIs, a reflow operation may be performed to form solder joints 116 between interconnects on dies 108 and 109 and the FLI layer of package substrate 202. Die interconnects may include thermal bond pads 111. The FLI layer may include die-attach thermal FLIs 103, IHS-attach thermal FLIs 104 and signal FLIs 112.

Figure 6D:
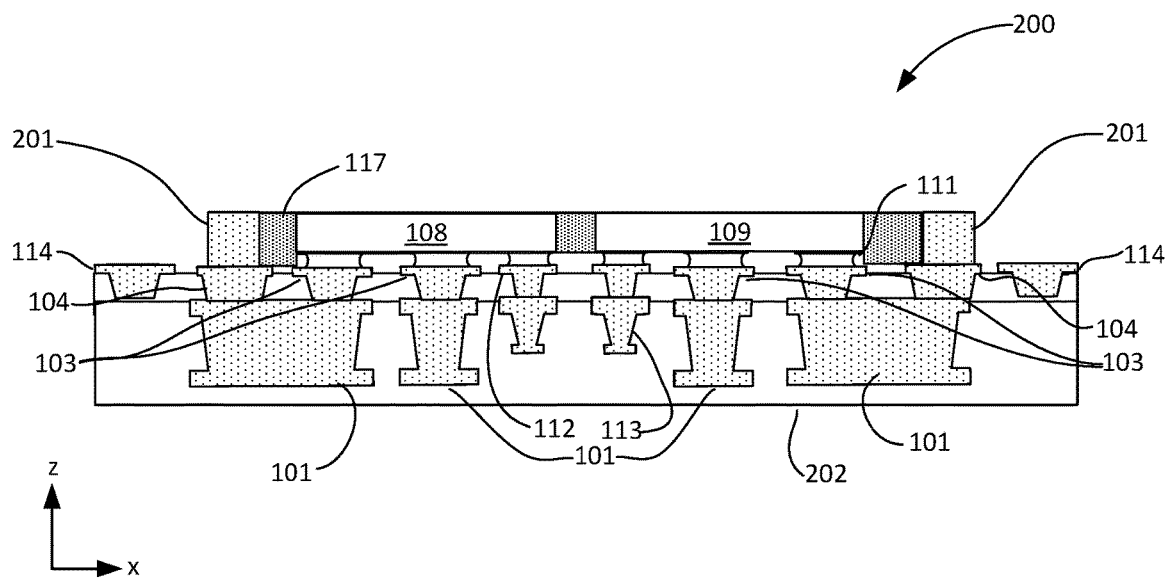

In the operation shown in FIG. 6D, IC package 200 may be potted in an epoxy fill 117 that is deposited over package substrate 202, filling in gaps between dies 108 and 109, and between pillars 201. In an optional operation, an underfill (not shown) may be added (e.g., a capillary underfill) filling in gaps between solder joints 116. Epoxy fill 117 may be formed by dispensing an epoxy resin over package substrate 202, then molding the liquid epoxy at an elevated temperature. During the molding operation, the epoxy may be cured to form epoxy fill 117. In the process, package substrate 202, dies 108 and 109 and pillars 201 are potted (encapsulated) in epoxy fill 117.

In a subsequent operation, a planarization of epoxy fill 117 and pillars 201 is performed. The planarization operation may be performed by grinding and/or polishing using a chemo-mechanical polishing tool. The planarization operation may level pillars to be at the same z-level (e.g., height) as the tops of dies 108 and 109. At the same time, epoxy fill 117 may be removed from tops of dies 108 and 109, exposing the backside of dies (e.g., attached by flip-chip mounting having backside facing up). Removal of excess epoxy from die and pillar surfaces that are to be interfaced with an IHS is necessary for a good thermal contact.

Figure 6E:
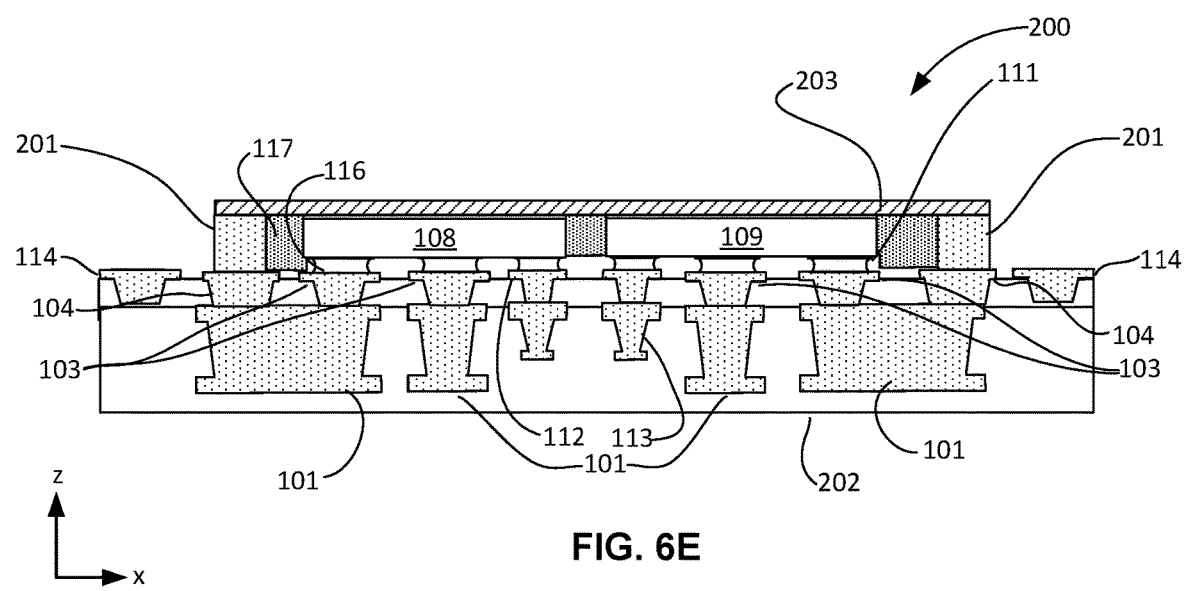

In the operation shown in FIG. 6E, TIM 203 is deposited over dies 108, 109, and pillars 201. As described above, TIM 203 may be a viscous liquid, such as a thermal grease. In some embodiments, TIM 203 is a solid or semisolid material. TIM 203 may be printed or dispensed.

Figure 6F:
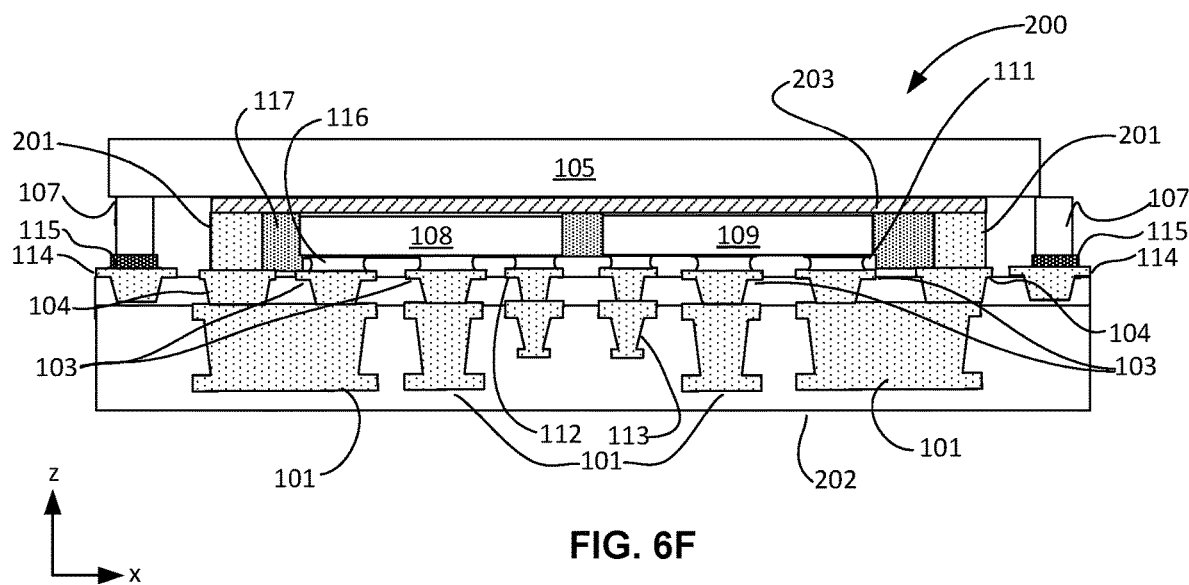

In the operation shown in FIG. 6F, an IHS comprising IHS lid 105 and IHS sidewalls 107 is attached to package substrate 202. IHS sidewalls 107 are aligned with anchor pads 114 on package substrate 202. In a previous operation (not shown) adhesive 115 was deposited over anchor pads 114. The IHS is placed over dies 108, 109 and pillars 201 such that IHS lid 105 is in contact with TIM 203 while IHS sidewalls 107 touch down on anchor pads 114, contacting adhesive 115. In a subsequent operation, the entire IC package 200 may be subjected to a thermal treatment at an elevated temperature where adhesive 115 is cured, cementing IHS sidewalls 107 to package substrate 102.

After IHS attachment, IC package 200 may be at a completed stage. Although not shown, the land side (e.g., bottom) of IC package 200 is solder bumped to form a BGA, so that IC package 200 may be soldered to a printed circuit board. When mounted, IC package may be interfaced with a thermal solution comprising a heat sink in contact with the IHS.

Figure 7:
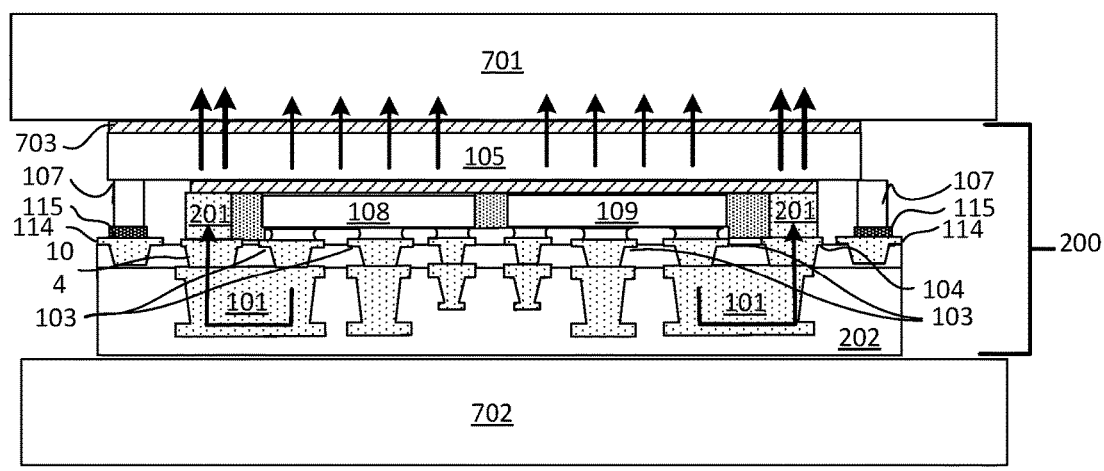
FIG. 7 illustrates a thermal solution mount for an IC package according to some embodiments of the disclosure.

FIG. 7 illustrates thermal solution mount 700 comprising heat sink 701 interfaced with IC package 200, according to some embodiments of the disclosure.

IC package 200 is shown mounted in mount 700 between heat sink 701 and printed circuit board 702, where TIM 703 is the thermal interface between heat sink 701 and IHS lid 105. TIM 702 may be an identical TIM layer as TIM 203 in FIGS. 6E and 6F. The arrows in the figure show potential heat conduction paths through thermal trench vias 101 and through direct flow from dies 108 and 109 to heat sink 701. Bent arrows show heat conduction through thermal trench vias 101 and through pillars 201. Heat may spread into IHS lid 105, and flow into heat sink 701. The large arrows indicate heat flow emanating from pillars 201, while the smaller arrows indicate heat emanating from dies 108 and 109.

Figure 8:
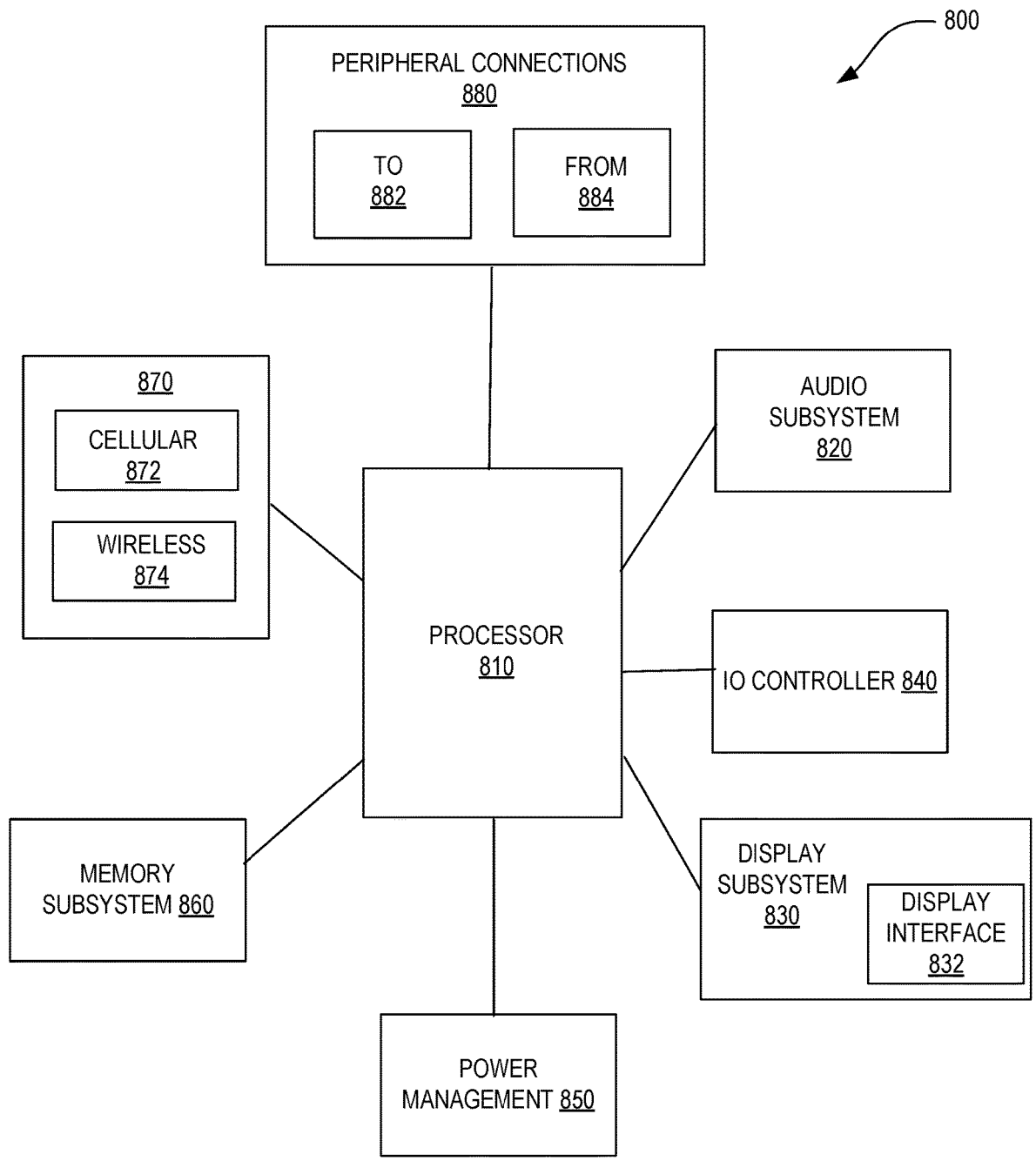
FIG. 8 illustrates a block diagram of a computing device comprising an IC package comprising package substrate 102 having embedded thermal trench vias 101 as part of a system-on-chip (SoC) package in an implementation of a computing device, according to some embodiments of the disclosure.

FIG. 8 illustrates a block diagram of computing device 800 comprising package substrate 102 having embedded thermal trench vias 101, as part of a system-on-chip (SoC) package in an implementation of a computing device, according to some embodiments of the disclosure.

According to some embodiments, computing device 800 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., processor 810 representing a central processing unit (CPU) or a graphical processing unit (GPU)), comprising one or more dies, is mounted on a motherboard of computing device 800. The IC package may dissipate a large amount of heat, where a high-efficiency thermal solution is required. In addition, the IC package may have significant amount of warpage or otherwise exhibit significant non-planarity. According to some embodiments, computing device 800 employs a conformable heat sink interface (e.g., any one of conformable heat sink interfaces 100, 200, 300 or 400 of the disclosure) mounted between the IC package and a thermal solution, where the conformable heat sink interface conforms to the contours of the warped or otherwise non-planar IC package, making contact with substantially 100% of the surface of the IC package at significantly reduced load on the IC package in comparison with a conventional thermal solution, as described above.

In some embodiments, computing device has wireless connectivity (e.g., Bluetooth and/or WiFi). It will be understood that certain components are shown generally, and not all components of such a device are shown in computing device 800.

The various embodiments of the present disclosure may also comprise a network interface within 870 such as a wireless interface so that a system embodiment may be incorporated into a wireless device, for example, cell phone or personal digital assistant.

According to some embodiments, processor 810 represents a CPU or a GPU, and can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) package, comprising:
    an IC package substrate comprising a dielectric;
    a first conductive layer on the dielectric, a second conductive layer within the dielectric and adjacent to the first conductive layer, and a third conductive layer within the dielectric parallel to the second conductive layer, the first conductive layer comprising thermal interconnects comprising first thermal interconnects and second thermal interconnects;
    one or more thermal conduits having a first end and a second end extending between the second conductive layers and the third conductive layers and extending laterally within the dielectric between the first and second ends, the first end coupled to a first thermal interconnect and the second end coupled to a second thermal interconnect;
    an integrated circuit (IC) die attached to the IC package substrate, wherein the IC die is bonded to one or more of the first thermal interconnects; and
    an integrated heat spreader over the IC die, wherein the integrated heat spreader is thermally coupled to one or more of the second thermal interconnects.

2. The IC package of claim 1, wherein at least one of the thermal conduits has a width that is substantially orthogonal to the length, and a height that is substantially orthogonal to the length and the width, and wherein the length is greater than the width and the height.

3. The IC package of claim 1, wherein the one or more thermal conduits comprise copper, gold, silver, nickel, or aluminum.

4. The IC package of claim 1, wherein a layer of thermal interface material (TIM) is between the second thermal interconnects and the integrated heat spreader.

5. The IC package of claim 4, wherein the TIM comprises an adhesive material.

6. The IC package of claim 1, wherein the integrated heat spreader is metallurgically bonded to the second thermal interconnects.

7. The IC package of claim 1, wherein the first thermal interconnect is metallurgically bonded to the first end of the thermal conduit.

8. The IC package of claim 1, wherein one or more sidewalls of the integrated heat spreader are thermally coupled to the second thermal interconnects.

9. The IC package of claim 1, wherein a bonding layer is between a sidewall of the integrated heat spreader and an anchor pad on the IC package substrate, and wherein the bonding layer comprises an adhesive material.

10. The IC package of claim 1, wherein a pillar having a height and width extends from a third thermal interconnect of the one or more thermal interconnects to a lid of the integrated heat spreader.

11. The IC package of claim 10, wherein the width of the pillar extends laterally in the x- and y-directions such that the width of the pillar is greater than the height of the pillar.

12. The IC package of claim 10, wherein the thermally conductive pillar has a height of at least 200 microns.

13. A method for making an IC package, comprising:
    receiving an IC package substrate, wherein:
        the IC package substrate comprises a first conductive layer on a dielectric, a second conductive layer within the dielectric and adjacent to the first conductive layer, and a third conductive layer within the dielectric parallel to the second conductive layer;
        the first conductive layer comprises one or more thermal interconnects comprising first thermal interconnects and second thermal interconnects; and
        one or more thermal conduits having a first end and a second end extend between the second conductive layers and the third conductive layers and extend laterally within the dielectric between the first and second ends, the first end coupled to a first thermal interconnect and the second end coupled to a second thermal interconnect;

attaching at least one IC die to the IC package substrate, wherein the at least one IC die is bonded to one or more of the first thermal interconnects; and mounting an integrated heat spreader over the at least one IC die, wherein the integrated heat spreader is thermally coupled to one or more of the second thermal interconnects.

14. The method of claim 13, wherein mounting the integrated heat spreader comprises depositing a layer of thermal interface material between a sidewall of the integrated heat spreader and the one or more thermal conduits.

15. The method of claim 13, wherein mounting the integrated heat spreader comprises growing a thermally conductive pillar over ones of the one or more thermal conduits, wherein the pillar extends a height over the dielectric and contacting the integrated heat spreader to the thermally conductive pillar.

16. The method of claim 15, wherein contacting the integrated heat spreader to the thermally conductive pillar comprises depositing a layer of thermal interface material between the thermally conductive pillar and the integrated heat spreader.

17. The method of claim 15, wherein growing the thermally conductive pillar comprises depositing a metal through a lithographically-defined mask aligned to the ones of the one or more thermal conduits, wherein the thermal conducive pillar is grown to a height of at least 100 microns over the ones of the one or more thermal conduits.

18. An integrated circuit (IC) package, comprising:
an IC package substrate comprising a dielectric;
a first conductive layer over the dielectric, a second conductive layer within the dielectric and adjacent to the first conductive layer, and a third conductive layer within the dielectric and adjacent to the second conductive layer, the first conductive layer comprising first thermal interconnects and second thermal interconnects;

one or more thermal conduits having a first end and a second end extending between the second and third conductive layers and extending laterally within the dielectric between the first and second ends, the first end coupled to a first thermal interconnect and the second end coupled to a second thermal interconnect;

an IC die attached to the IC package substrate, wherein the IC die is bonded to one or more of the first thermal interconnects; and an integrated heat spreader over the IC die, wherein the integrated heat spreader is thermally coupled to one or more of the second thermal interconnects.

19. The IC package of claim 18, wherein a thermal interface material (TIM) is between the one or more second thermal interconnects and the integrated heat spreader.

20. The IC package of claim 18, wherein the integrated heat spreader is thermally coupled to one or more of the second thermal interconnects by one or more sidewalls of the integrated heat spreader.

21. The IC package of claim 18, wherein a pillar extends from a third thermal interconnect of the first conductive layer to a lid of the integrated heat spreader.

* * * * *